United States Patent [19]

Guterman

[11] Patent Number: 4,527,258
[45] Date of Patent: Jul. 2, 1985

[54] E²PROM HAVING BULK STORAGE

[75] Inventor: Daniel C. Guterman, Plano, Tex.

[73] Assignee: Mostek Corporation, Carrollton, Tex.

[21] Appl. No.: 431,464

[22] Filed: Sep. 30, 1982

[51] Int. Cl.³ .................... G11C 7/00; G11C 11/40
[52] U.S. Cl. .................................. 365/185; 365/184; 365/189; 357/23.5
[58] Field of Search ............... 365/174, 185, 189, 184; 357/23

[56] References Cited

U.S. PATENT DOCUMENTS 4,302,766 11/1981 Guterman et al. ............. 357/23 VT
4,331,968 5/1982 Gosney, Jr. et al. ............. 365/185
4,460,979 7/1984 Brahmbhatt ..................... 365/182

OTHER PUBLICATIONS

Drori et al, "A Single 5v supply Nonvolatile Static RAM", IEEE ISSCC, Feb. 19, 1981, pp. 148–149.
Müller et al, "An 8192-Bit Electrically Alterable ROM Employing a One Transistor Cell with Floating Gate", IEEE Journal of Solid State Circuits, vol. SC-12, No. 5, Oct. 1977, pp. 507–514.

Primary Examiner—Stuart N. Hecker
Assistant Examiner—Glenn A. Gossage
Attorney, Agent, or Firm—Eric W. Petraske

[57] ABSTRACT

An electrically erasable programmable read only memory employs a single unsteered on-chip high voltage generator that applies high voltage simultaneously to all cells on the chip.

3 Claims, 2 Drawing Figures

E²PROM HAVING BULK STORAGE

DESCRIPTION

1. Technical Field

The field of the invention is that of electrically alterable read only memory.

2. Background Art

An article by Rudolph G. Müller et al in the IEEE Journal of Solid State Circuits, Vol. SC-12 No. 5, October 1977, entitled "An 8192-Bit Electrically Alterable ROM Employing a One-Transistor Cell With Floating Gate" discloses an electrically alterable read only memory (EAROM) cell having a floating gate which is charged or discharged by application of relatively high voltage, approximately 20 or 25 volts. This high voltage is switched to different cells by circuits on the chip, a method which tends to degrade chip reliability because the high voltage may punch through the insulation between adjacent conducting lines. A copending U.S. patent application, Ser. No. 400,171 illustrates an improved nonvolatile storage device which reduces the amount of chip area which each cell takes.

It would be desirable to have an EAROM that requires little decoding and signal conditioning of the high voltage.

DISCLOSURE OF INVENTION

The invention relates to an electrically erasable programmable read only memory (EEPROM or E²-PROM) employing a single unsteered on-chip high voltage generator, small cell size and reduced susceptibility to high voltage breakdown.

A feature of the invention is the multiple use of few control lines for each cell.

Another feature of the invention is the reduction in the amount of overhead used for switching voltages greater than 5 volts in magnitude.

Yet another feature of the invention is the reduction in the amount of diffusion conducting elements exposed to high voltage to a single node of minimal area.

BEST MODE FOR CARRYING OUT THE INVENTION

Figure 1:
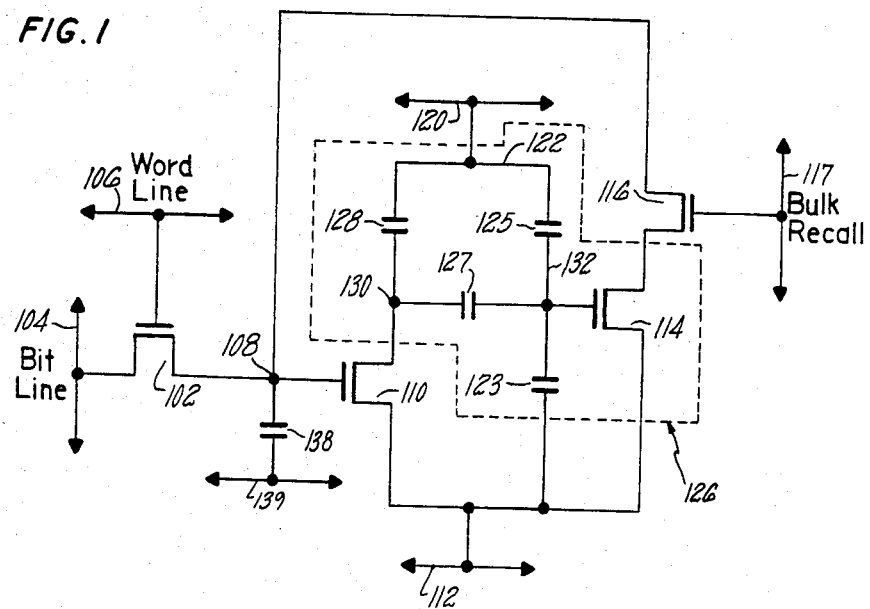
FIG. 1 illustrates a schematic diagram of a memory cell constructed according to the invention.

In FIG. 1, word line 106 controls the gate of transistor 102 which permits passage of current between bit line 104 and first node 108. Node 108 is connected to the gate of input transistor 110 which connects virtual ground 112 and control gate 130 of nonvolatile storage device 126, shown within a dotted line. Virtual ground line 112 is normally at ground, but is raised in voltage as described below. Control gate 130 is capacitively coupled to floating gate 132 of device 126. This storage device, which will be described further below, incorporates voltage electrode 122 for capacitively coupling high voltage from bulk store line 120 to control gate 130 through capacitor 128 and for applying high voltage to erase capacitor 125. Floating gate 132 controls passage of current through transistor 114 which is connected between virtual ground 112 and recall transistor 116 having its gate connected to bulk recall line 117. Transistor 116 is further connected back to node 108 for reading out stored information.

Figure 2:
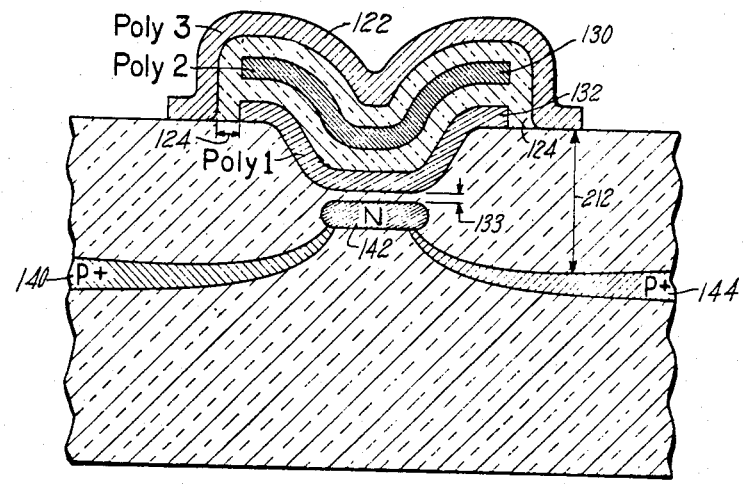
FIG. 2 illustrates in cross section a non-volatile memory element used in the cell of FIG. 1.

Floating gate 132 is capacitively coupled to: (a) control gate 130 through coupling capacitor 127; (b) voltage electrode 122 through erase capacitor 125; and (c) virtual ground through tunnel capacitor 123. Floating gate 132 and control gate 130 are shown schematically in FIG. 1 as nodes and the associated capacitance is indicated by a conventional capacitor symbol. Physically, as is shown in FIG. 2 below, gates 130 and 132 are layers of polysilicon positioned and sized to produce the desired capacitive relationships.

In the read operation, word line 106 is set at a logical 1 turning on transistor 102 so that current may pass from bit line 104 through the memory cell. Bulk recall line 117 is normally high so that transistor 116 is normally on. If transistor 114, controlled by floating gate 132, is on, there will be a path to ground through transistor 102 and the voltage on node 108 will be low with a nominal value of 0.5 volts or logical 0. If transistor 114 is off, current will now flow and node 108 will be at a higher voltage, logical 1, determined by the various circuit elements and having a nominal value of about 2 volts. The actual levels are determined by circuit and sensing requirements. Conventional sense amplifiers connected to bit line 104 sense the current flow and voltage on the bit line, as in any read only memory.

Transistor 114 is either on or off depending on the state of floating gate 132 which is set by a combination of bulk store line 120 and transistor 110. If it is desired to set node 108 at a logical 0, i.e. to make transistor 114 conducting, then, in the storage operation, node 108 must be high to turn transistor 110 on and provide a path from virtual ground 112 through transistor 110 to control gate 130. Bulk store line 120 is ramped to a high voltage of 20 volts or greater causing voltage electrode 122 to rise to that voltage. Floating gate 132 is coupled capacitively to control gate 130 by coupling capacitor 127, so that with transistor 110 being on and control gate 130 being at a low voltage, floating gate 132 is held at a low voltage and a sizable voltage appears across erase capacitor 125 between a sidewall of voltage electrode 122 and floating gate 132. A strong electric field in gap 124 (shown in FIG. 2) pulls electrons off floating gate 132 leaving a net positive charge. This positive charge, during the read cycle of the cell, keeps transistor 114 on, thus maintaining node 108 at a low voltage. If it is desired to provide a logical 1 during a read cycle, node 108 is maintained at a low voltage during the store cycle, turning transistor 110 off and permitting control gate 130 to rise in voltage through the large capacitance of coupling capacitor 128, taking with it floating gate 132 because of the strong capacitive coupling between the two gates (shown as capacitor 127). The high voltage from bulk store line 120 will then appear across gap 133 of capacitor 123, a tunneling oxide layer of approximately 125 angstroms between floating gate 132 and the n-doped virtual grounded substrate 142. Electrons will be pulled from the grounded substrate to the floating gate leaving a net negative charge that will keep transistor 114 turned off during the read operation, leaving node 108 at the higher voltage value of logical 1. Thus, the voltage at 108 during the read cycle is the inverse of the voltage in node 108 during the store cycle.

An important feature of the invention is the extensive multiple use of the various control lines used for the memory cell, thereby decreasing the memory cell area and increasing the number of cells that may be placed on a chip. The cell in the preferred embodiment has two control lines, bit line 104 and word line 106, that are conventional addressing lines known in the art. Each cell is further connected to four lines that are common to the entire cell array; bulk store line 120, bulk recall line 117, hard ground line 139 and virtual ground line 112. The multi-use of control lines resulting in small cell area is provided at the expense of a complex set-up and store sequence. This complexity is not a serious disadvantage, however, because programming an EEPROM is a slow process which occurs infrequently.

A further advantage of the invention is provided by the use of a single bulk store line common to the whole array, so that it is not necessary to steer the high voltage of 20 or more volts from one cell to another during the storage position. Some prior art cells do steer the high voltage and therefore run a risk of having the voltage break through the insulating regions in the integrated circuit, endangering reliability.

The principle of storage in this invention is to set up the proper data in all the cells and then to perform a bulk store on all cells. It is therefore necessary to set up all the input nodes 108 of the unselected cells, those that are not to be changed, to reflect their internally stored data. The voltages at various parts during the storage sequence are listed in Table I.

In the storage sequence, the first operation as shown in Table I is to discharge the node 108 of all the cells. For discharge, all column lines are set to 0 volts, all row lines are set to 5 volts, the bulk recall line may be either 0 volts or 5 volts, the virtual ground line 112 is set at 0 volts and the bulk store is set at 0 volts. All nodes 108 then discharge to 0 volts through transistors 102.

The second step is to set up the data on the unselected nodes 108. All unselected bits lines of the unselected cells are floated; the word lines of the unselected rows are set at 0 volts; the bulk recall line is set at 5 volts and the virtual ground line 112 is changed from 0 volts to 5 volts after the unselected row lines have reached the 0 volt level. If the memory cell has stored a logical 1 on floating gate 132, transistor 114 is turned on and current will flow from the 5 volts of virtual ground 112 through transistor 114 and through transistor 116, which is turned on by bulk recall line 117, to node 108, charging it up to a logical 1 level of about 4 V. If the storage cell is storing a logical 0 on floating gate 132, transistor 114 will be turned off, no current will flow through transistors 114 and 116 and node 108 of that cell will remain in its discharged state.

The third step in the sequence is to set up the desired data for a selected cell. The bit line 104 of that cell is set to the inverted value of the data that is to be read out; the word line of the selected cell is set to 5 volts, the unselected cell nodes remaining unchanged; the bulk recall line is set to 0 volts and the nodes 108 of the selected cells are charged to logical 1 or 0, depending on the input data to be stored. The second portion of this third step is, after bulk recall reaches 0 volts, to change the virtual ground from its previous value of 5 volts, which maintained the cell's internal data on the unselected nodes 108, back down to its normal level of 0 volts. The nodes 108 of all memory cells are unaffected by this change because they are isolated from virtual ground by recall transistor 116. The correct data is now on all nodes 108, the new data being on the selected cells and the unselected cells having data corresponding to the already stored nonvolatile data. This data will remain on node 108 for a period of time determined by the leakage of those nodes. Throughout this sequence of steps, bulk store remains at 0 volts.

When virtual ground line 112, bulk recell line 117 and word line 106 are returned from 5 volts to 0 volts, capacitive loading of node 108 by these lines will tend to reduce the voltage representing a logical 1. This problem is minimized by capacitor 138, connected between node 108 and a hard ground line 139 or to the substrate.

An optional fourth step is to isolate the bit lines of the selected cells by returning the voltage on the selected row line 106 to 0.

Although only one row can be selected in a given store operation, any number of cells on that row could be selected along that row by continuing the setup process until all data to be stored has been set up. The main requirement is that the entire store procedure must take place and be complete before data on nodes 108 collapses because of leakage. The foregoing explanation has assumed that the overhead circuitry comprising the chip is structured to handle bits sequentially. It is also possible to organize a memory chip on a byte-wide or word-wide basis, in which several selected bits on the same row would be set up simultaneously. If desired, the entire row could be set up simultaneously.

The final storage step is shown on line 5 of Table I in which the word lines remain at 0 volts; the bulk recall line is at 0 volts isolating node 108 of all cells from virtual ground; virtual ground remains at 0 volts; the data stored on nodes 108 is unchanged and bulk store line 120 is ramped from 0 volts to a high voltage of 20

TABLE I

| | | Bit Line 104 | Word Line 106 | Bulk Recall 117 | Virtual Ground 112 | Node 108 | Bulk Store | |
|---|---|---|---|---|---|---|---|---|
| (1) Discharge Nodes | | All →0V | All →5V | 0V or 5V | 0V | All →0V | 0V | |
| (2) Set Up Unselected Nodes | (a) | float unsel. | 0 unsel. | 5V | " | " | " | Set Bulk Recall to 5V, then set Virtual |
| | (b) | float unsel. | 0 unsel. | " | →5V | (0V) (4V) | " | Ground to 5V after Word Line reaches 0V. |
| (3) Set Up Selected Nodes | (a) | Data Sel. | 5V Sel. | →0V | 5V | Data Sel. | " | Bulk Recall is dropped, isolating Nodes 108 |
| | (b) | Data Sel. | 5V Sel. | 0V | →0V | Data | | before Virtual Ground is dropped. |
| (4) Isolate Nodes (Optional) | | no change | Sel. →0V | 0V | 0V | no change | " | Data remains at nodes. |
| (5) Store | | no change | 0 | 0 | 0 | no change | →25V | | volts or greater. At this time, a logical 1 at node 108 implies that transistor 110 is turned on, control gate 130 is held low by being connected to virtual ground 112 so that the strong capacitive coupling maintains floating gate 132 at a low voltage value, bulk store line 120 places a geometrically enhanced high field across gap 124 between the sidewall of electrode 122 and the edge of floating gate 132, pulling electrons off floating gate 132 and leaving it with a net positive charge that will turn transistor 114 on during a read operation. Thus a logical 1 at node 108 during storage results in transistor 114 being turned on during read and will give a logical 0 during the read operation. A logical 0 at node 108 during store means that transistor 110 will be turned off, control gate 130 will float up at a high voltage through the strong capacitive coupling of capacitor 128 with store electrode 112 carrying floating gate 132 with it, the high field will appear in the narrow tunneling oxide region 133 between floating gate 132 and the n-doped virtual grounded substrate 142, pulling electrons from the substrate on to floating gate 132 and leaving it with a net negativve charge. Thus a logical 0 at node 108 during store will result in transistor 114 being turned off during read. After sufficient time has elapsed to established a final charge state on floating gate 132, bulk store line 120 is returned to 0 volts and the chip is ready for read or for the next group of selected bits on a selected row to be altered.

The unselected cells will be substantially unaffected by the bulk storage sequence because a positive charge on floating gate 132 will produce a logical 1 at node 108 that will, in turn, merely reinforce the charge situation on the floating gate 132 and thus minimize exposure to the high fields on the oxide regions 124 and 133 and the cell will not be worn out additionally to any significant degree. The purpose of this complex setup sequence is to let the various control and address lines and cell transistors do multiple duty, thereby minimizing the transistor count and number of control lines. It also allows for a cell which requires only a single high voltage input, the store signal, which is common to all cells and minimizes the exposure to substrate of high voltage to only one small region, the diffusion portion of node 130.

The use of a single high voltage input and the use of "self-steering" that eliminates high voltage decoding and routing circuitry affords layout flexibility. Nonvolatile storage element 126 makes use of a vertically stacked assemblage of components, as disclosed in co-pending U.S. patent application, Ser. No. 400,171, assigned to the assignee hereof. This arrangement aids in reducing the cell area. One point that deserves emphasis is that it is important to keep transistor 116 between node 108 and transistor 114 in order to reduce coupling between the floating gate through the channel of transistor 114 which will be changing in voltage during the store sequence, and node 108.

FIG. 2 illustrates in cross section a portion of the nonvolatile storage element 126 taken through floating gate 132, illustrating the correlation between different layers of polysilicon and the circuit element which are formed by interaction of those layers. Floating gate 132 is the first layer of polysilicon disposed on the substrate and having a thin oxide layer separated by distance 133 from an n-doped region 142 of the substrate which is used as the virtual ground conductor means to supply electrons to floating gate 132. The capacitance of oxide layer 133 is shown as capacitor 123 in FIG. 1. N-doped region 142 having a medium implant concentration is adjacent to p+doped regions 140 and 144 that are used as channel stops between adjacent conducting regions in the substrate. Control gate 130 is formed from a second layer of polysilicon extending over the floating gate to provide the strong capacitive coupling of capacitor 127 which is required to control floating gate 132 in voltage. Strong coupling of capacitor 127 is accomplished by extending floating gate 132 over thick oxide 212 of typically 10,000 angstroms. This provides a large area where control gate 130 overlays floating gate 132 which is needed to produce strong coupling capacitance 127. Control gate 130 and floating gate 132 are separated by a conventional insulating oxide layer of approximately 750 angstroms thick. Electrode 122 is the high voltage electrode of the gate and is formed from the third layer of polysilicon. Electrode 122 is connected to bulk storage line 120 and extends downwardly, enclosing the control gate and floating gate. The distance of closest approach 124, between electrode 122 and floating gate 132 is along the sidewall of electrode 133 and forms capacitor 125 which is used to remove stored electrons, i.e. to pull electrons off floating gate 132. The separation distance between these two layers of polysilicon (122 and 132), about 750 angstroms, is indicated as distance 124.

Those skilled in the art will have no difficulty, in the light of this disclosure, in constructing a timing sequence to carry out the operation summarized in Table I. One simple approach is to employ a sequence of RC delay chains that are interlocked to prevent race conditions. It is an advantageous feature of the invention that the timing may be quite slow, so that any of a number of timing mechanisms may be employed.

I claim:

1. An electrically alterable read only memory comprising:

a plurality of memory cells, each comprising:

an electrically alterable nonvolatile memory element;

means for reading out data entered in said nonvolatile element;

means for writing data to be stored in said nonvolatile memory element, characterized in that:

said means for reading out data comprises an output transistor connected between a bit line and a first node and having its gate controlled by a word line, and a recall transistor connected between a first terminal of a nonvolatile floating gate transistor and said first node and having its gate controlled by a recall signal common to all of said plurality of cells, a second terminal of which floating gate transistor is connected to a virtual ground terminal;

said means for writing data comprises means for placing the logical inverse of the data to be stored on said first nodes of all of said memory cells and high voltage electrode means common to all of said memory cells for applying a high voltage simultaneously to each of said memory cells, whereby a floating gate within said nonvolatile memory element is controlled in response to said inverted data on said first node by a control transistor connected between virtual ground and a control gate of said floating gate transistor, while said recall transistor is maintained in a nonconducting state, the gate of which control transistor is connected to said first node.

2. An electrically alterable read only memory according to claim 1, further characterized in that:

said means for writing data into said nonvolatile memory element includes means for turning on said recall transistor and means for raising said virtual ground terminal to a predetermined voltage, whereby a path for charging said first node is formed from said first node through said recall transistor and said floating gate transistor to said virtual ground terminal, the continuity of said path being dependent on the state of said floating gate.

3. An electrically alterable read only memory according to claim 2, further characterized in that:
said means for writing data includes a capacitor connected between said first node and ground.

* * * * *